(12) United States Patent
Choi et al.

(10) Patent No.: US 8,760,596 B2
(45) Date of Patent: Jun. 24, 2014

(54) THIN FILM TRANSISTOR ARRAY PANEL AND DISPLAY DEVICE INCLUDING THE SAME, AND MANUFACTURING METHOD THEREOF

(75) Inventors: Tae-Young Choi, Seoul (KR); Bo Sung Kim, Seoul (KR); Young Min Kim, Yongin-si (KR); Seon-Pil Jang, Seoul (KR); Kang Moon Jo, Seoul (KR); Yeon Taek Jeong, Seoul (KR); Ki Beom Lee, Seoul (KR)

(73) Assignee: Samsung Display Co., Ltd. (KR)

( * ) Notice: Subject to any disclaimer, the term of this patent is extended or adjusted under 35 U.S.C. 154(b) by 294 days.

(21) Appl. No.: 13/173,457

(22) Filed: Jun. 30, 2011

(65) Prior Publication Data

US 2012/0120362 A1    May 17, 2012

(30) Foreign Application Priority Data

Nov. 17, 2010    (KR) .................. 10-2010-0114498

(51) Int. Cl.
*G02F 1/136*    (2006.01)
(52) U.S. Cl.
USPC .......................................... 349/47
(58) Field of Classification Search
USPC ........................................ 349/43, 46–47
See application file for complete search history.

(56) References Cited

U.S. PATENT DOCUMENTS

| 2002/0158995 A1 | 10/2002 | Hwang et al. |
| 2005/0221542 A1 | 10/2005 | Yamazaki et al. |
| 2006/0164573 A1* | 7/2006 | Tanaka .......................... 349/113 |
| 2007/0228389 A1 | 10/2007 | Hsu et al. |
| 2010/0033804 A1* | 2/2010 | Aoki ............................. 359/296 |
| 2010/0208187 A1* | 8/2010 | Saito et al. .................... 349/143 |

FOREIGN PATENT DOCUMENTS

| JP | 10031227 A | 2/1998 |
| JP | 2006189780 A | 7/2006 |
| KR | 1020070001758 A | 1/2007 |
| KR | 1020070098472 A | 10/2007 |
| KR | 1020080031090 A | 4/2008 |
| KR | 1020090037725 A | 4/2009 |
| KR | 1020090058995 A | 6/2009 |

* cited by examiner

*Primary Examiner* — Phu Vu
(74) *Attorney, Agent, or Firm* — Cantor Colburn LLP

(57) ABSTRACT

A thin film transistor array panel includes a source electrode and a drain electrode on an insulating substrate, an oxide semiconductor on the insulating substrate and overlapping the source electrode and the drain electrode, a passivation layer overlapping the oxide semiconductor and on the insulating substrate, a gate electrode on the passivation layer, and a pixel electrode connected to the drain electrode. The gate electrode and the pixel electrode include a same material. The oxide semiconductor is between the source electrode and the gate electrode, and between the drain electrode and the gate electrode in a cross-sectional view of the thin film transistor array panel.

39 Claims, 19 Drawing Sheets

THIN FILM TRANSISTOR ARRAY PANEL AND DISPLAY DEVICE INCLUDING THE SAME, AND MANUFACTURING METHOD THEREOF

This application claims priority to Korean Patent Application No. 10-2010-0114498 filed on Nov. 17, 2010, and all the benefits accruing therefrom under 35 U.S.C. §119, the entire contents of which are incorporated herein by reference.

BACKGROUND OF THE INVENTION (1) Field of the Invention

The present invention relates to a thin film transistor ("TFT") array panel, a display device including the same, and a manufacturing method thereof.

(2) Description of the Related Art

A liquid crystal display is one of the most widely used flat panel displays. The liquid crystal display is a display device that includes two display panels on which electrodes are formed, and a liquid crystal layer that is disposed therebetween, and controls the intensity of transmitted light by rearranging liquid crystal molecules of the liquid crystal layer by applying the voltage to the electrodes.

A TFT array panel that is one of two display panels constituting the liquid crystal display, is used as a circuit board for independently driving each pixel in a liquid crystal display, an organic electro luminescence ("EL") display device, and the like.

In general, the TFT array panel includes a scanning signal wire or gate wire that transmits a scanning signal, an image signal line or data wire that transmits an image signal, a TFT that is connected to the gate wire and the data wire, a pixel electrode that is connected to the TFT, a gate insulating layer that covers and insulates the gate wire, and an interlayer insulating layer that covers and insulates the TFT and the data wire.

The TFT array panel including a plurality of layers may be manufactured by a pattern of each layer being formed using a photosensitive thin film, through exposure and development processes using a photomask for each layer, and etching the thin film with the mask. However, since a large cost is required when a photomask is used, as the number of masks is decreased, the manufacturing cost is decreased.

In a case when the semiconductor that is included in the TFT uses oxide semiconductor, the characteristic of the semiconductor is excellent but the oxide semiconductor may be easily damaged in a manufacturing step.

In the case when a bottom gate of the TFT is formed using the oxide semiconductor, when the oxide semiconductor is exposed to the atmosphere, or when the metal that is formed on the oxide semiconductor is dry etched, a channel part is damaged by steam ($H_2O$) in the atmosphere or by dry etching gas, such that the characteristic of the TFT may be seriously degraded. In addition, a wet etching method may be considered in order to remove the damage by the dry etching as described above. However, in the case when an etching speed of the oxide semiconductor is faster than an etching speed of the upper metal, it is impossible to form the TFT.

Therefore, after the oxide semiconductor layer is formed, the oxide semiconductor may be damaged by the etching solution that is used when the source electrode and drain electrode are formed thereon. In order to reduce the damage, in general, an etching prevention layer is formed on the oxide semiconductor layer. However, in the case when the etching prevention layer is further formed, since a mask for forming the etching prevention layer is further required, the manufacturing cost is increased and the manufacturing steps become complicated.

The above information disclosed in this Background section is only for enhancement of understanding of the background of the invention and therefore it may contain information that does not form the prior art that is already known in this country to a person of ordinary skill in the art.

BRIEF SUMMARY OF THE INVENTION

The present invention provides a thin film transistor ("TFT") array panel that can reduce a manufacturing cost and manufacturing steps when an oxide semiconductor is used in a TFT, and a manufacturing method thereof.

An exemplary embodiment of the present invention provides a TFT array panel including a source electrode and a drain electrode that are disposed on an insulating substrate, an oxide semiconductor that is disposed on the insulating substrate and overlapping the source electrode and the drain electrode, a passivation layer that overlaps the oxide semiconductor and the insulating substrate, and a gate electrode and a pixel electrode that are disposed on the passivation layer. The gate electrode and the pixel electrode include a same material.

In an exemplary embodiment, the TFT array panel may further include a barrier layer that is disposed between the insulating substrate and the source electrode, and between the insulating substrate and the drain electrode.

In an exemplary embodiment, the barrier layer may include silicon oxide (SiOx).

In an exemplary embodiment, the source electrode and the drain electrode may each be a dual-layer structure that includes a lower layer and an upper layer. The lower layer may include an opaque metal such as aluminum (Al), molybdenum (Mo), copper (Cu), mercury (Ag), chromium (Cr), tungsten (W), niobium (Nb), titanium (Ti) or tantalum (Ta), and the upper layer may include a transparent conducting oxide that is an oxide of indium (In), zinc (Zn), tin (Sn), aluminum (Al) or gallium (Ga).

In an exemplary embodiment, the passivation layer may have a contact hole that exposes a portion of the drain electrode, and the pixel electrode may be connected through the contact hole with the drain electrode.

In an exemplary embodiment, the TFT array panel may further include an insulating layer pattern that is disposed on the oxide semiconductor, and has the same plane shape as the oxide semiconductor.

Another exemplary embodiment of the present invention provides a method for manufacturing a TFT array panel, including forming a source electrode and a drain electrode on an insulating substrate, forming an oxide semiconductor on the source electrode and the drain electrode, forming a passivation layer that overlaps the oxide semiconductor and the insulating substrate, and forming a gate electrode and a pixel electrode within a same layer on the passivation layer.

Yet another exemplary embodiment of the present invention provides a display device including a first display panel, a second display panel and a liquid crystal layer disposed between the first and second display panels. The first display panel includes a source electrode and a drain electrode that are disposed on a first insulating substrate, an oxide semiconductor that is disposed on the first insulating substrate and overlapping the source electrode and the drain electrode, a passivation layer that overlaps the oxide semiconductor and on the first insulating substrate, and a gate electrode and a pixel electrode that are disposed on the passivation layer. The second display panel faces the first display panel and includes a common electrode disposed on a second insulating substrate.

Still another exemplary embodiment of the present invention provides a display device including a first display panel, a second display panel and an electrophoretic member that is disposed between the first display panel and the second display panel. The first display panel includes a source electrode and a drain electrode that are disposed on a first insulating substrate, an oxide semiconductor that is disposed on the source electrode and the drain electrode, a passivation layer that overlaps the oxide semiconductor and on the first insulating substrate, and a gate electrode and a pixel electrode that are disposed on the passivation layer. The second display panel faces the first display panel and includes a common electrode disposed on a second insulating substrate. The electrophoretic member includes a first electrophoretic particle and a second electrophoretic particle having different charges.

According to exemplary embodiments of the present invention, since a etching stop layer is further not required, such as by forming a source electrode and a drain electrode, by forming an oxide semiconductor layer thereon, by covering the oxide semiconductor layer with a gate insulating layer for protection, and by forming a gate electrode, a manufacturing cost is reduced and a manufacturing step is simplified.

In addition, the number of masks is reduced, the manufacturing cost is reduced, and the manufacturing step is simplified by forming the gate electrode and pixel electrode with the same layer by using one mask.

BRIEF DESCRIPTION OF THE DRAWINGS

The above and other aspects and features of this disclosure will become more apparent by describing in further detail exemplary embodiments thereof with reference to the accompanying drawings, in which:

FIGS. 13, 15, and 17 are plan views that sequentially illustrate another exemplary embodiment of a manufacturing method of a TFT array panel, according to the present invention.

DETAILED DESCRIPTION OF THE INVENTION

Figure 1:
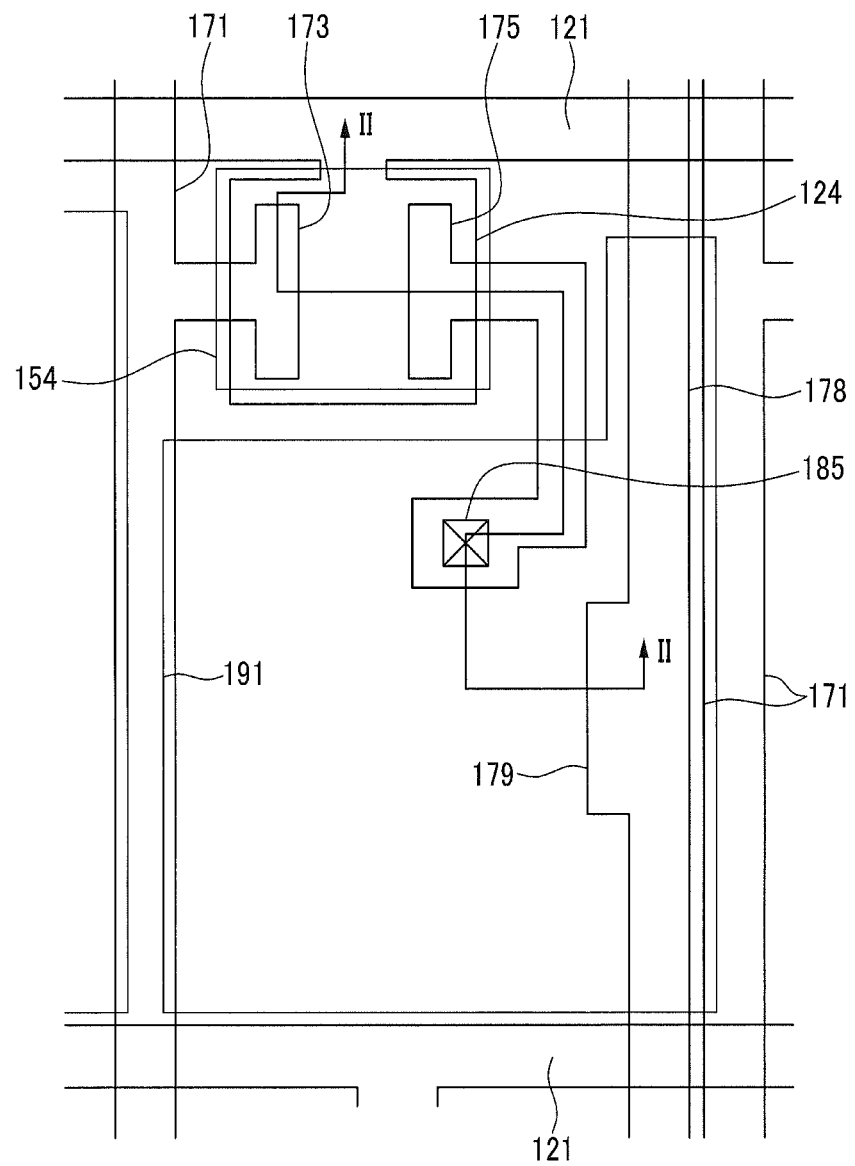
FIG. 1 is a plan view that illustrates an exemplary embodiment of one pixel of a thin film transistor ("TFT") array panel, according to the present invention.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In the drawings, the thickness of layers, films, panels, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "beneath," "lower," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "beneath" or "lower" relative to other elements or features would then be oriented "upper" relative to the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, the invention will be described in detail with reference to the accompanying drawings.

Figure 2:
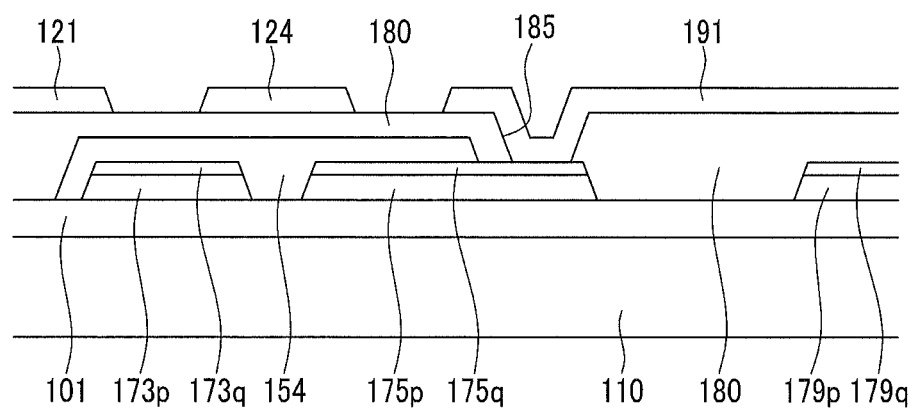
FIG. 2 is a cross-sectional view taken along line II-II of FIG. 1.

FIG. 1 is a plan view that illustrates an exemplary embodiment of one pixel of a thin film transistor ("TFT") array panel, according to the present invention, and FIG. 2 is a cross-sectional view taken along the line II-II of FIG. 1.

Referring to FIGS. 1 and 2, a barrier layer 101 is directly on an insulating substrate 110 which includes a transparent glass or plastic. The barrier layer 101 reduces or effectively prevents diffusion and penetration of an impurity from the substrate 110 to an oxide semiconductor 154. The barrier layer 101 may include silicon oxide (SiOx).

On the barrier layer 101, a data line 171, a drain electrode 175, and a storage electrode line 178 including a storage electrode 179 are disposed. The data line 171 transmits a data signal. The data line 171 may include a source electrode 173, and may include an end portion having a wide planar area in order to connect another layer of the TFT array panel or an external driving circuit (not shown). The storage electrode line 178 may include an extended storage electrode 179. In an exemplary embodiment, the TFT array panel may include a plurality of data lines 171, a plurality of drain electrodes 175, and a plurality of storage electrode lines 178 including a plurality of storage electrodes 179 on the barrier layer 101.

When a data driving circuit (not shown) that generates the data signal is integrated (e.g., directly) on the substrate 110, the data line 171 may be directly connected to the data driving circuit. The drain electrode 175 is disposed to be separated from the source electrode 173 and faces the source electrode 173, as illustrated in the plan view of FIG. 1.

The data line 171, the source electrode 173, the drain electrode 175, and the storage electrode line 178 have a dual-layer structure that is formed of a lower layer and an upper layer. In the illustrated embodiment, the source electrode 173 of the data line 171, the drain electrode 175 and the storage electrode 179 of the storage electrode line 178 include lower layers 173$p$, 175$p$, and 179$p$ and upper layers 173$q$, 175$q$, and 179$q$, respectively. The lower layers 173$p$, 175$p$, and 179$p$ may include an opaque metal such as aluminum (Al), molybdenum (Mo), copper (Cu), mercury (Ag), chromium (Cr), tungsten (W), niobium (Nb), titanium (Ti) or tantalum (Ta) or an alloy thereof and may have a multilayer structure including the metal and/or the alloy thereof. The upper layers 173$q$, 175$q$, and 179$q$ may include transparent conducting oxide ("TCO") that is an oxide of indium (In), zinc (Zn), tin (Sn), aluminum (Al) or gallium (Ga). Since the upper layers 173$q$, and 175$q$ of the data line 171 and drain electrode 175 have a similar work function to the oxide semiconductor 154, contact resistance is reduced, such that a contact characteristic to the oxide semiconductor 154 is increased.

The oxide semiconductor 154 is directly on and contacting portions of both the source electrode 173 and drain electrode 175. The oxide semiconductor 154 includes oxide of zinc (Zn), gallium (Ga), tin (Sn) or indium (In) as a basis, or zinc oxide (ZnO), indium-gallium-zinc oxide (InGaZnO$_4$), indium-zinc oxide (Zn—In—O), or zinc-tin oxide (Zn—Sn—O) that is complex oxide thereof. In an exemplary embodiment, the oxide semiconductor 154 may be formed by using a solution process such as an inkjet process.

A passivation layer 180 is directly on and contacting portions of the oxide semiconductor 154. The passivation layer 180 includes inorganic insulators such as silicon nitride or silicon oxide, an organic insulator, a low dielectric insulator, and the like. It is preferable that dielectric constants of the organic insulator and the low dielectric insulator are 4.0 or less. Among the organic insulators, in an exemplary embodiment, the passivation layer 180 may be formed by using the organic insulator having the photosensitivity, and the surface of the passivation layer 180 may be flat. In the case of the TFT array panel according to the exemplary embodiment of the present invention, the passivation layer 180 acts as the gate insulating layer while acting as the passivation layer itself.

A contact hole 185 that exposes a portion of the drain electrode 175, is extended completely through a thickness of the passivation layer 180.

A gate lines 121 including a gate electrode 124, and a pixel electrode 191 are on the passivation layer 180. The gate line 121 and pixel electrode 191 are in a same layer, and may be formed simultaneously in the same layer during a manufacturing process of the TFT array panel. In an exemplary embodiment, the TFT array panel may include a plurality of gate lines 121 including a plurality of gate electrodes 124, and a plurality of pixel electrodes 191 on the passivation layer 180.

The gate line 121 transfers a gate signal and mainly extends in a horizontal (e.g., transverse) direction. The gate line 121 includes a plurality of gate electrodes 124 that protrudes from the gate line 121, and an end portion having a wide planar area (not shown) for connection with another layer of the TFT array panel or external driving circuit. When a gate driving circuit (not shown) that generates a gate signal is integrated (e.g., directly) on the substrate 110, the gate line 121 may extend to be directly connected to the gate driving circuit. The gate electrode 124 overlaps the oxide semiconductor 154.

The gate line 121 and pixel electrode 191 may include an aluminum-based metal such as aluminum (Al) or aluminum alloy, a silver-based metal such as silver (Ag) or silver alloy, a copper-based metal such as copper (Cu) or copper alloy, a molybdenum-based metal such as molybdenum (Mo) or molybdenum alloy, chromium (Cr), tantalum (Ta), titanium (Ti), and tungsten (W). The gate line 121 and pixel electrode 191 may include materials such as metals having good reflection characteristics.

In an exemplary embodiment of the TFT array panel according to the present invention, since it is possible to reduce or effectively prevent damage to the oxide semiconductor in a manufacturing process without using a further etching stop layer, such as by forming a data line, a source electrode and a drain electrode before the oxide semiconductor layer is formed, by covering (e.g., overlapping) the oxide semiconductor with the passivation layer that acts as the gate insulating layer for protection, and by forming the gate line and gate electrode after the passivation layer is formed, the manufacturing process is simplified and a manufacturing cost is reduced. In addition, the manufacturing process is further simplified and the manufacturing cost is further reduced by simultaneously forming the pixel electrode in conjunction with the gate line and gate electrode within the same layer.

Figure 3:
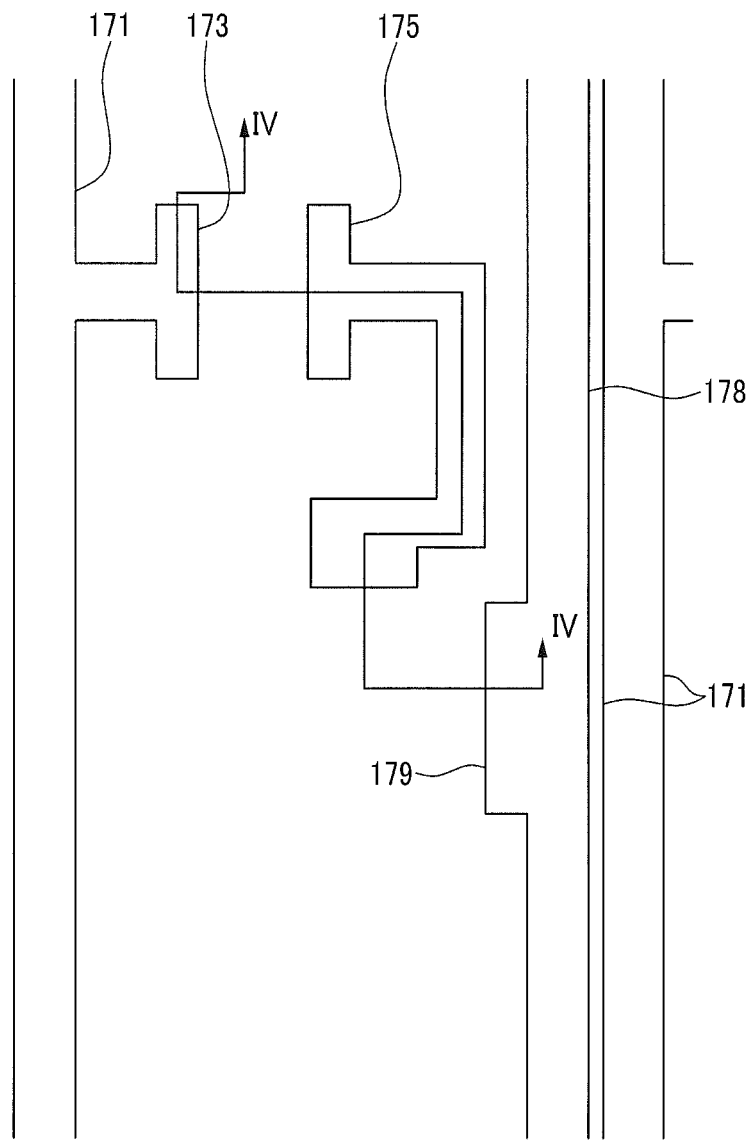
FIGS. 3, 5 and 7 are plan views that sequentially illustrate an exemplary embodiment of a manufacturing method of the TFT array panel in FIGS. 1 and 2, according to the present invention.
Figure 4:
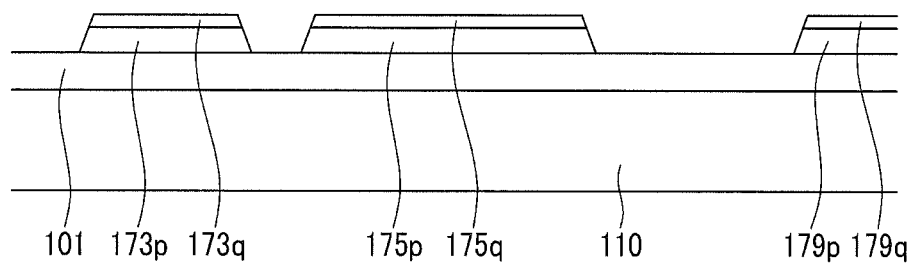
FIG. 4 is a cross-sectional view taken along line IV-IV of the TFT array panel of FIG. 3.
Figure 5:
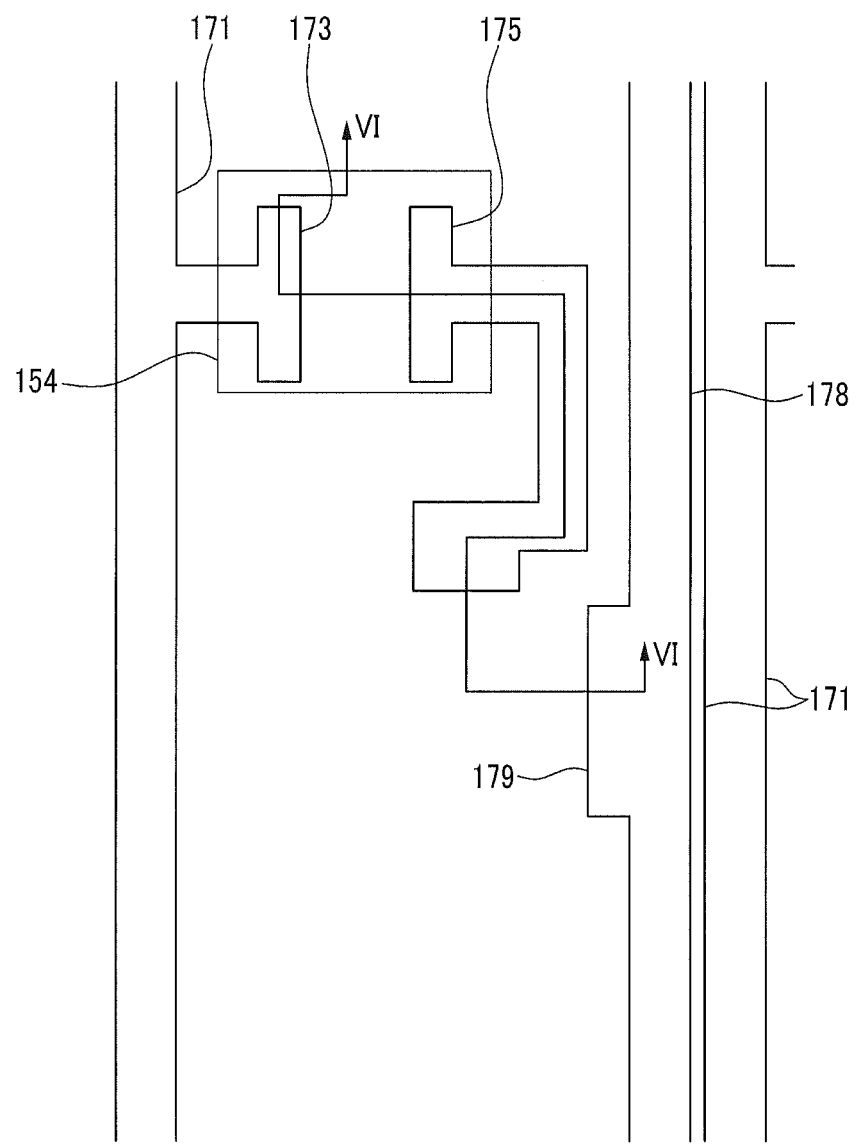
Figure 7:
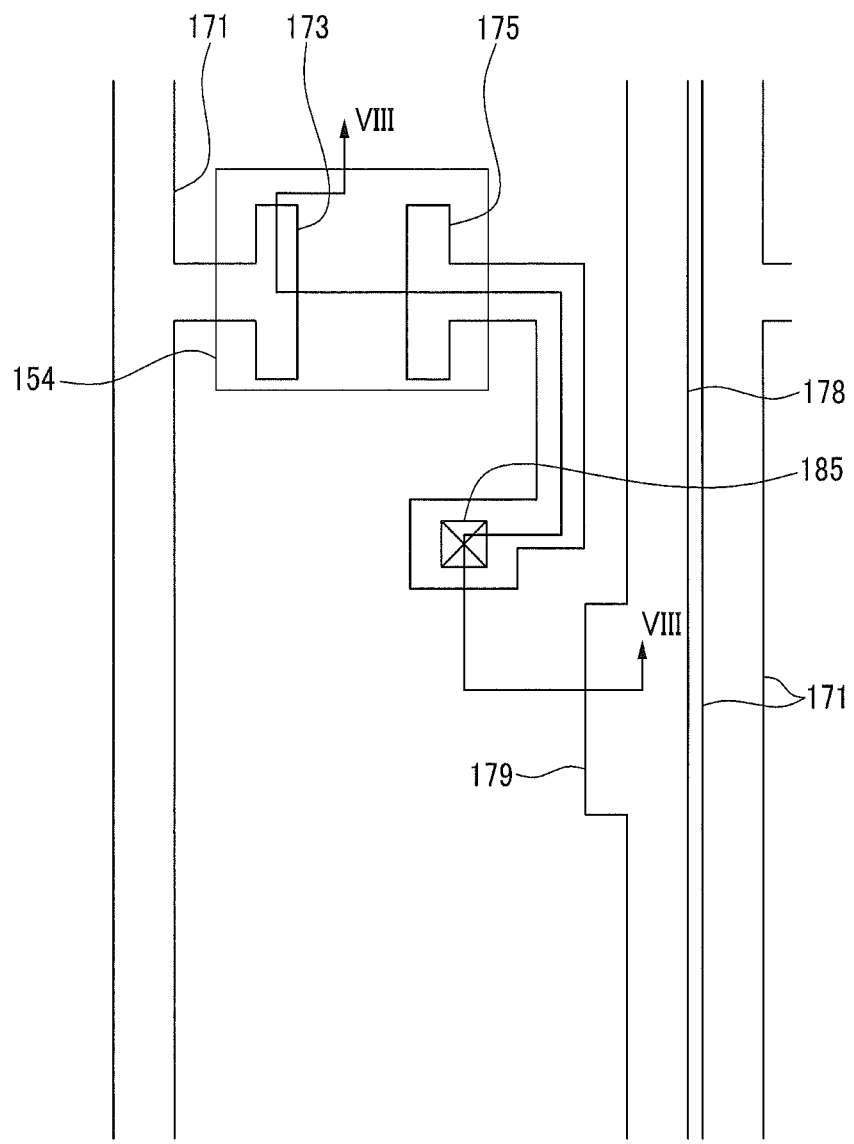
Figure 8:
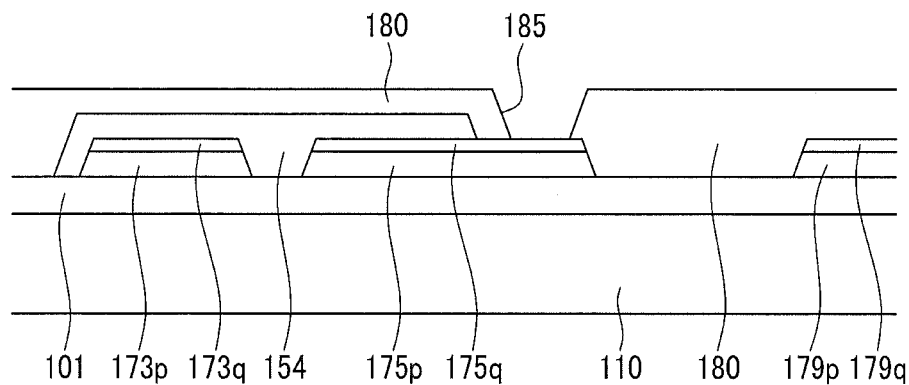
FIG. 8 is a cross-sectional view taken along line VIII-VIII of the TFT array panel of FIG. 7.

A manufacturing method of a TFT array panel according to the present invention will be described with reference to FIGS. 3 to 8 in conjunction with FIGS. 1 and 2. FIGS. 3, 5, and 7 are plan views that sequentially illustrate an exemplary embodiment of a manufacturing method of a TFT array panel according to the present invention. FIG. 4 is a cross-sectional view taken along line IV-IV of the TFT array panel of FIG. 3, FIG. 6 is a cross-sectional view taken along line VI-VI of the TFT array panel of FIG. 5, and FIG. 8 is a cross-sectional view taken along line VIII-VIII of the TFT array panel of FIG. 7.

First, referring to FIGS. 3 and 4, a data line 171, a source electrode 173, a drain electrode 175, and a storage electrode line 178 that includes a storage electrode 179 are formed by layering a barrier layer 101 that includes silicon oxide (SiOx) on an insulating substrate 110, layering a conducting layer on the barrier layer 101, and photolithographying the resulting structure.

The source electrode 173 of the data line 171, the drain electrode 175, and the storage electrode 179 of the storage electrode line 178 have a dual-layer structure that is formed of lower layers 173p, 175p, and 179p, and upper layers 173q, 175q, and 179q, respectively. The lower layers 173p, 175p, and 179p may include a metal such as aluminum (Al), molybdenum (Mo), copper (Cu), mercury (Ag), chromium (Cr), tungsten (W), niobium (Nb), titanium (Ti) or tantalum (Ta) or an alloy thereof, and may have a multilayer structure including the metal and/or the alloy thereof. The upper layers 173q, 175q, and 179q are formed of TCO that is an oxide of indium (In), zinc (Zn), tin (Sn), aluminum (Al) or gallium (Ga). Since the upper layers 173q, and 175q of the data line 171 and drain electrode 175 have a similar work function to the oxide semiconductor 154, contact resistance is reduced, such that a contact characteristic to the oxide semiconductor 154 is increased.

Figure 6:
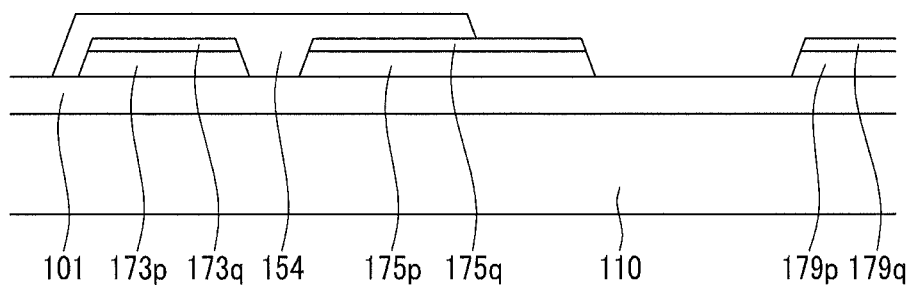
FIG. 6 is a cross-sectional view taken along line VI-VI of the TFT array panel of FIG. 5.

Next, referring to FIGS. 5 and 6, the oxide semiconductor 154 is formed on and overlapping both the source electrode 173 and drain electrode 175. The oxide semiconductor 154 includes oxides of zinc (Zn), gallium (Ga), tin (Sn) or indium (In) as a basis, or zinc oxide (ZnO), indium-gallium-zinc oxide (InGaZnO$_4$), indium-zinc oxide (Zn—In—O), or zinc-tin oxide (Zn—Sn—O) that are complex oxides thereof. The oxide semiconductor 154 may be formed by using a solution process such as inkjet process.

Next, with reference to FIG. 7 and FIG. 8, a passivation layer 180 including a contact hole 185 exposing a portion of the drain electrode 175 is formed by layering and etching an inorganic insulator such as silicon nitride or silicon oxide, an organic insulator, and an insulator having low dielectricity on the oxide semiconductor 154. The passivation layer 180 acts as a gate insulating layer while acting as the passivation layer itself. The passivation layer 180 may be formed on the entire surface of the substrate 110 except for an end portion of the data line 171 that is connected to an external driving circuit (not shown).

Next, as shown in FIG. 1 and FIG. 2, the gate line 121 that includes the gate electrode 124 overlapping the oxide semiconductor 154, and the pixel electrode 191 that is contacted with the drain electrode 175 through the contact hole 185, are formed on the passivation layer 180. The gate line 121 and pixel electrode 191 are simultaneously formed by layering the same conducting layer and photolithographying the resulting structure. The gate line 121 and pixel electrode 191 may include materials such as metals having good reflection characteristics.

According to the illustrated exemplary embodiment of the manufacturing method of the TFT array panel according to the present invention, since it is possible to reduce or effectively prevent damage to the oxide semiconductor in the manufacturing process without using a further etching stop layer, such as by forming a data line, a source electrode and a drain electrode before the oxide semiconductor layer is formed, by covering (e.g., overlapping) the oxide semiconductor with the passivation layer that acts as the gate insulating layer for protection, and by forming the gate line and gate electrode after the passivation layer is formed, the manufacturing process is simplified and a manufacturing cost is reduced. In addition, the manufacturing process is further simplified and the manufacturing cost is further reduced by simultaneously forming the pixel electrode in conjunction with the gate line and gate electrode within the same layer.

Figure 9:
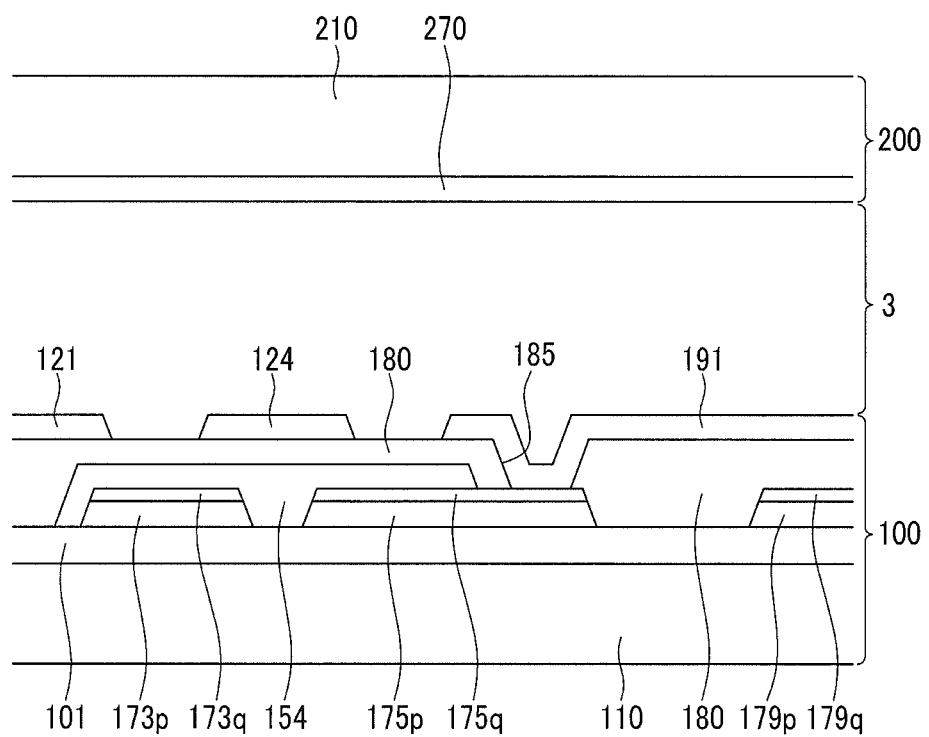
FIG. 9 is a cross-sectional view of an exemplary embodiment of a display device, according to the present invention.

A TFT array panel according to the exemplary embodiment in FIG. 1 to FIG. 8 will be described in detail with reference to a display panel including the TFT array panel. FIG. 9 is a cross-sectional view of an exemplary embodiment of a display device, according to the present invention.

With reference to FIG. 9, the display device includes a TFT array display panel 100 and a common electrode display panel 200 that face each other, and a liquid crystal layer 3 that is between the two display panels 100 and 200.

The TFT array display panel 100 is the same as the TFT array panel according to the exemplary embodiment that is illustrated in FIG. 1 and FIG. 2.

The barrier layer 101 is disposed on a first insulating substrate 110, the source electrode 173, the drain electrode 175 and the storage electrode 179 are disposed on the barrier layer 101, and the oxide semiconductor 154 is disposed on (e.g., overlapping) the source electrode 173 and drain electrode 175. The passivation layer 180 that has the contact hole 185 exposing the drain electrode 175 is disposed on the oxide semiconductor 154, and the gate electrode 124 and pixel electrode 191 are disposed on the passivation layer 180. In a manufacturing method, the gate line 121 and pixel electrode 191 are simultaneously formed in a same layer.

The common electrode display panel 200 includes a common electrode 270 that is disposed on a second insulating substrate 210. Although not shown in the drawings, the common electrode display panel 200 may further include a light blocking member and a color filter.

The liquid crystal layer 3 includes a plurality of liquid crystal molecules (not shown). If a voltage is applied to the pixel electrode 191 and common electrode 270, an electric field is generated in the liquid crystal layer 3, and the arrangement of the liquid crystal molecules is changed according to a change of the intensity of the electric field. In one exemplary embodiment, for example, the polarization of light is changed by changing the arrangement of the liquid crystal molecules of the liquid crystal layer, while the electric field is applied. A polarizer (not shown) displays a desired image by appropriately blocking or transmitting polarized light such that light and dark regions are generated. The display device according to the illustrated exemplary embodiment may be a reflective liquid crystal display device in which light transmitted from an outside of the display device, such as natural light rays, is transmitted initially through the liquid crystal layer 3, reflected, and then transmitted back through the liquid crystal layer 3.

Figure 10:
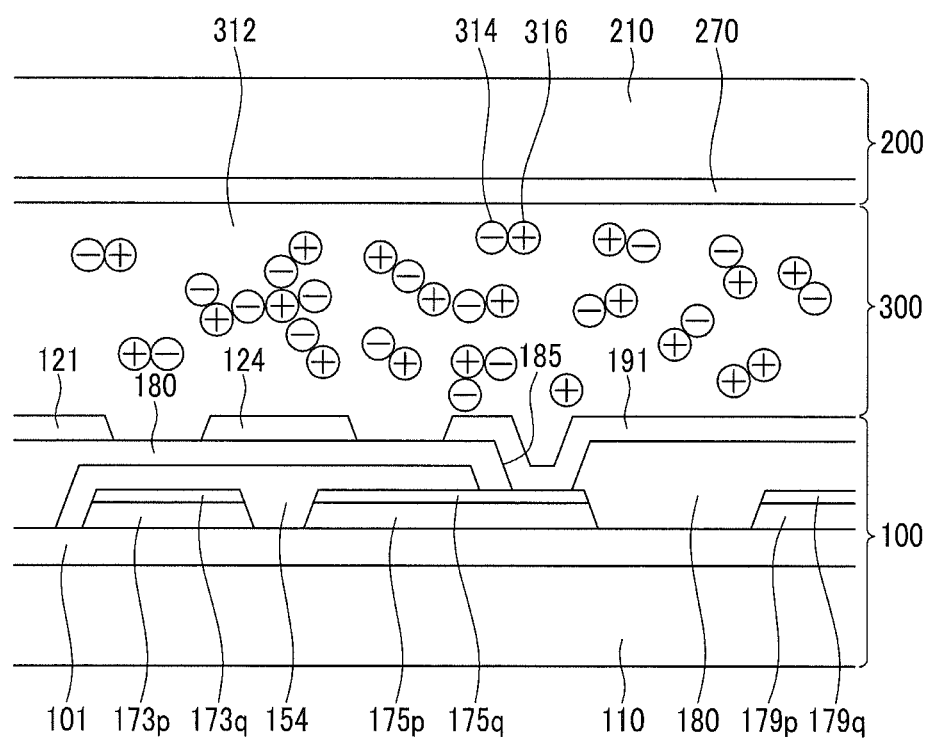
FIG. 10 is a cross-sectional view of another exemplary embodiment of a display device, according to the present invention.

Another exemplary embodiment of a display device that includes the TFT array panel according to the present invention will be described with reference to FIG. 10. FIG. 10 is a cross-sectional view of another exemplary embodiment of a display device according to the present invention.

With reference to FIG. 10, the display device includes a TFT array display panel 100 and a common electrode display panel 200 that face each other, and an electrophoretic member 300 that is disposed between the two display panels 100 and 200. The electrophoretic member 300 includes electrophoretic particles 314 and 316.

The TFT array display panel 100 is the same as the TFT array panel according to the exemplary embodiment that is illustrated in FIG. 1 and FIG. 2.

The barrier layer 101 is disposed on a first insulating substrate 110, the source electrode 173, the drain electrode 175 and the storage electrode 179 are disposed on the barrier layer 101, and the oxide semiconductor 154 is disposed on (e.g., overlapping) the source electrode 173 and drain electrode 175. The passivation layer 180 that has the contact hole 185 exposing the drain electrode 175 is disposed on the oxide semiconductor 154, and the gate electrode 124 and pixel electrode 191 are disposed on the passivation layer 180. In a manufacturing method, the gate line 121 and pixel electrode 191 are simultaneously formed in a same layer.

The common electrode display panel 200 includes a common electrode 270 that is disposed on a second insulating substrate 210. The common electrode 270 is a transparent electrode including indium tin oxide ("ITO") or indium zinc oxide ("IZO"), and a common voltage is applied to each electrophoretic particle 314 and 316 of the electrophoretic member 300.

The common electrode 270 that applies the common voltage displays black and white gray or color images having various brightnesses by applying a predetermined voltage for driving for a predetermined time to each electrophoretic particle 314 and 316, in conjunction with the pixel electrode 191 applying the data voltage and changing the positions of the electrophoretic particles 314 and 316.

The electrophoretic member 300 includes a transparent dispersion medium 312, and a first electrophoretic particle 314 and a second electrophoretic particle 316 that are irregularly dispersed in the transparent dispersion medium 312.

The first electrophoretic particle 314 is a charged particle that has a white color and displays white to the outside of the display device, by reflecting external light, and has a negative (−) charge. The second electrophoretic particle 316 is a charged particle that has a black color and displays black to the outside of the display device by absorbing external light, and has a positive (+) charge. In an alternative embodiment, the first electrophoretic particle 314 and the second electrophoretic particle 316 may have the positive charge and negative charge, respectively.

In an alternative exemplary embodiment of the display device, the electrophoretic member 300 may include the first and second electrophoretic particles 314 and 316, and further include a plurality of microcapsules that stores the dispersion medium 312. In this case, the electrophoretic member 300 including the microcapsules may be fixed by a binder or a fixed film between both display panels 100 and 200.

Figure 11:
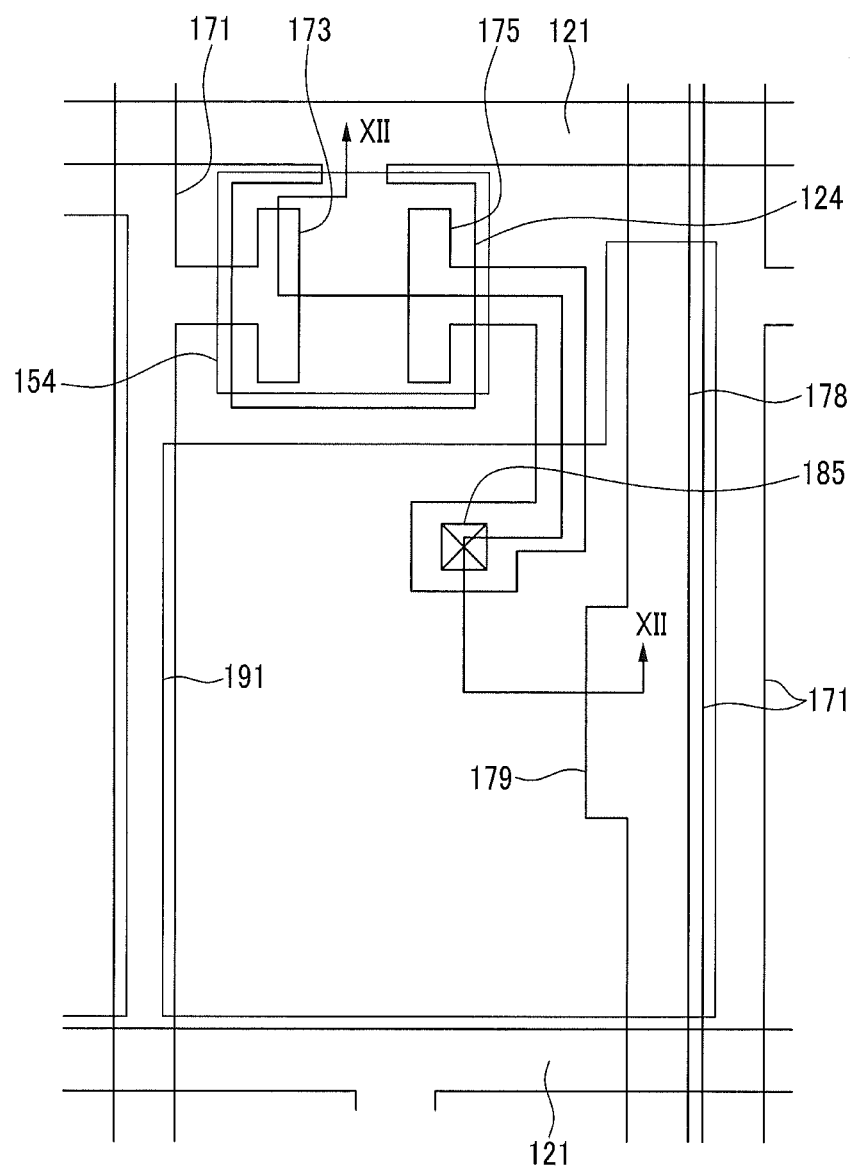
FIG. 11 is a plan view of another exemplary embodiment of one pixel of a TFT array panel, according to the present invention.

Another exemplary embodiment of a TFT array panel according to the present invention will be described with reference to FIG. 11 and FIG. 12. FIG. 11 is a plan view of an exemplary embodiment of one pixel of a TFT array panel according to the present invention, and FIG. 12 is a cross-sectional view taken along line XII-XII of FIG. 11.

Figure 12:
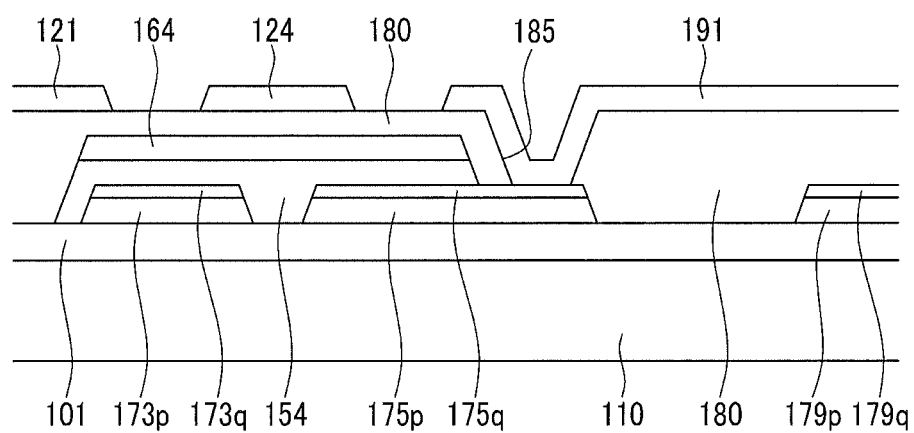
FIG. 12 is a cross-sectional view taken along line XII-XII of FIG. 11.

Referring to FIG. 11 and FIG. 12, a barrier layer 101 is directly on an insulating substrate 110. The barrier layer 101 reduces or effectively prevents diffusion and penetration of an impurity from the substrate 110 to an oxide semiconductor 154. The barrier layer 101 may include silicon oxide (SiOx).

On the barrier layer 101, a data line 171, a drain electrode 175, and a storage electrode line 178 including a storage electrode 179 are disposed. The data line 171 may include a source electrode 173, and may include an end portion having a wide planar area in order to connect another layer of the TFT array panel or an external driving circuit (not shown). The storage electrode line 178 may include an extended storage electrode 179. In an exemplary embodiment, the TFT array panel may include a plurality of data lines 171, a plurality of drain electrodes 175, and a plurality of storage electrode lines 178 including a plurality of storage electrodes 179 on the barrier layer 101.

The data line 171, the source electrode 173, the drain electrode 175 and the storage electrode line 178 have a dual-layer structure that is formed of a lower layer and an upper layer. In the illustrated embodiment, the source electrode 173 of the date line 171, the drain electrode 175 and the storage electrode 179 of the storage electrode line 178 include lower layers 173*p*, 175*p*, and 179*p* and upper layers 173*q*, 175*q*, and 179*q*, respectively. The lower layers 173*p*, 175*p*, and 179*p* may include an opaque metal such as aluminum (Al), molybdenum (Mo), copper (Cu), mercury (Ag), chromium (Cr), tungsten (W), niobium (Nb), titanium (Ti) or tantalum (Ta) or an alloy thereof, and may have a multilayer structure including the metal and/or alloy thereof. The upper layers 173*q*, 175*q*, and 179*p* may include TCO that is an oxide of indium (In), zinc (Zn), tin (Sn), aluminum (Al) or gallium (Ga). Since the upper layers 173*q* and 175 of the data line 171 and drain electrode 175 have a similar work function to the oxide semiconductor 154, contact resistance is reduced, such that a contact characteristic to the oxide semiconductor 154 is increased.

The oxide semiconductor 154 is directly on and contacting portions of both the source electrode 173 and drain electrode 175. The oxide semiconductor 154 includes oxides of zinc (Zn), gallium (Ga), tin (Sn) or indium (In) as a basis, or zinc oxide (ZnO), indium-gallium-zinc oxide (InGaZnO$_4$), indium-zinc oxide (Zn—In—O), or zinc-tin oxide (Zn—Sn—O) that are complex oxides thereof. In an exemplary embodiment, the oxide semiconductor 154 may be formed by using a solution process such as an inkjet process.

An insulating layer pattern 164 is directly on and overlapping the oxide semiconductor 154. The insulating layer pattern 164 includes insulators such as silicon nitride or silicon oxide. The insulating layer pattern 164 of the TFT array panel according to the exemplary embodiment, has almost the same plane shape as the oxide semiconductor 154 that is disposed therebeneath.

A passivation layer 180 is directly on and contacting the insulating layer pattern 164.

The passivation layer 180 includes inorganic insulators such as silicon nitride or silicon oxide, an organic insulator, a low dielectric insulator, and the like. It is preferable that dielectric constants of the organic insulator and low dielectric insulator are 4.0 or less. Among the organic insulators, in an exemplary embodiment, the passivation layer 180 may be formed by using the organic insulator having the photosensitivity, and the surface of the passivation layer 180 may be flat. In the case of the TFT array panel according to the exemplary embodiment of the present invention, the passivation layer 180 acts as the gate insulating layer while acting as the passivation layer itself.

A contact hole 185 that exposes a portion of the drain electrode 175 is extended completely through a thickness of the passivation layer 180.

A gate line 121 including a gate electrode 124, and a pixel electrode 191 are on the passivation layer 180. The gate line 121 and pixel electrode 191 are in a same layer and may be formed simultaneously in the same layer during a manufacturing process of the TFT array panel. In an exemplary embodiment, the TFT array panel may include a plurality of gate lines 121 including a plurality of gate electrodes 124 and a plurality of pixel electrodes 191 on the passivation layer 180.

The gate line 121 transfers a gate signal and mainly extends in a horizontal (e.g., transverse) direction. The gate line 121 includes a plurality of gate electrodes 124 that protrudes from the gate line 121, and an end portion having a wide planar area (not shown) for connection with another layer of the TFT array panel or external driving circuit. The gate electrode 124 overlaps the oxide semiconductor 154.

The gate line 121 and pixel electrode 191 may include an aluminum-based metal such as aluminum (Al) or aluminum alloy, a silver-based metal such as silver (Ag) or silver alloy, a copper-based metal such as copper (Cu) or copper alloy, a molybdenum-based metal such as molybdenum (Mo) or molybdenum alloy, chromium (Cr), tantalum (Ta), titanium (Ti), and tungsten (W). The gate line 121 and pixel electrode 191 may include materials such as metals having good reflection characteristics.

In an exemplary embodiment of the TFT array panel according to the present invention, since it is possible to reduce or effectively prevent damage to the oxide semiconductor in a manufacturing process without using a further etching stop layer, such as by forming a data line, a source electrode and a drain electrode before the oxide semiconductor layer is formed, by covering (e.g., overlapping) the oxide semiconductor with the insulating layer pattern, by covering the insulating layer with a passivation layer that acts as the gate insulating layer for protection, and by forming the gate line and gate electrode after the passivation is formed, a manufacturing process is simplified and a manufacturing cost is reduced. In addition, the manufacturing process is further simplified and the manufacturing cost is further reduced by simultaneously forming the pixel electrode in conjunction with the gate line and gate electrode with the same layer.

Figure 13:
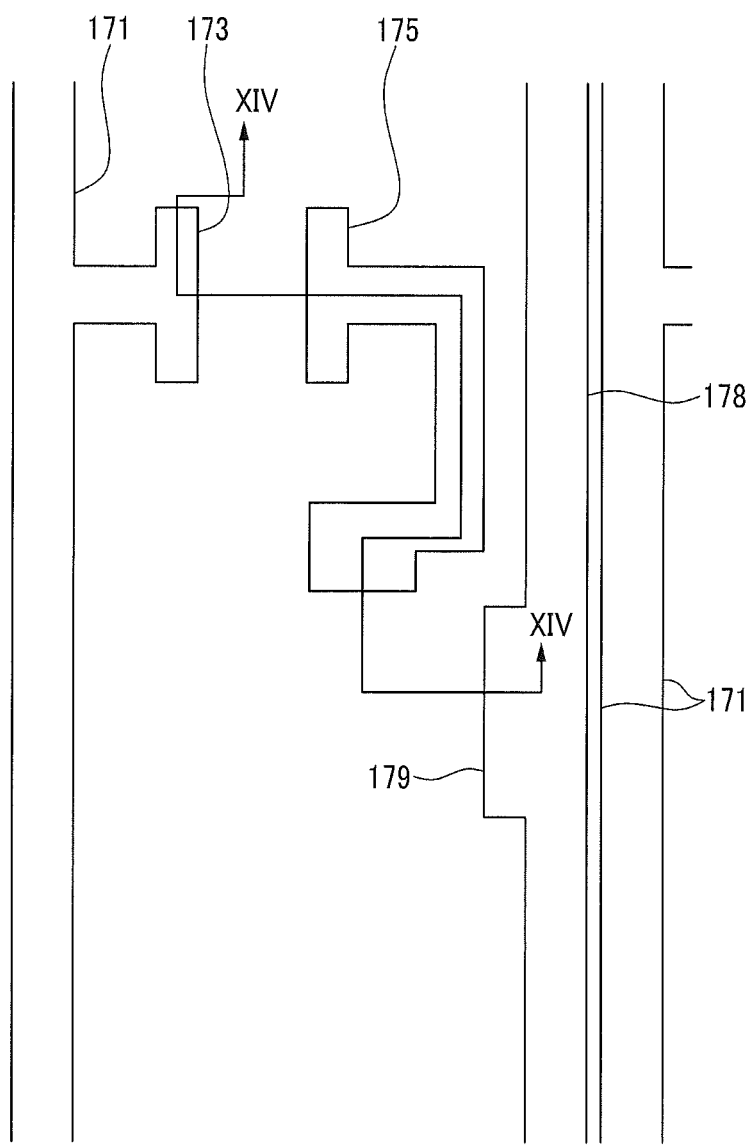

A manufacturing method of a TFT array panel according to the present invention will be described in detail with reference to FIGS. 13 to 16, FIGS. 17A to 17C, and FIGS. 18 and 19 in conjunction with FIGS. 11 and 12. FIGS. 13, 15, and 17 are plan views that sequentially illustrate an exemplary embodiment of a manufacturing method of a TFT array panel according to the present invention, FIG. 14 is a cross-sectional view taken along line XIV-XIV of the TFT array panel of FIG. 13, FIG. 16 is a cross-sectional view taken along line XVI-XVI of the TFT array panel of FIG. 15, FIGS. 17A to 17C are cross-sectional views that sequentially illustrate manufacturing steps of the TFT array panel of FIGS. 15 and 16, and FIG. 19 is a cross-sectional view taken along line XVIII-XVIII of the TFT array panel of FIG. 18.

Figure 14:
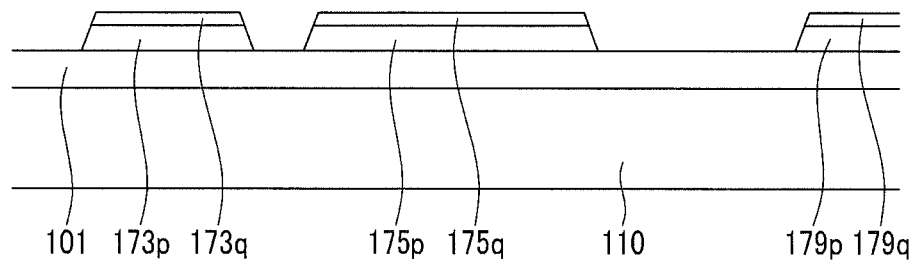
FIG. 14 is a cross-sectional view taken along line XIV-XIV of the TFT array panel of FIG. 13.
Figure 15:
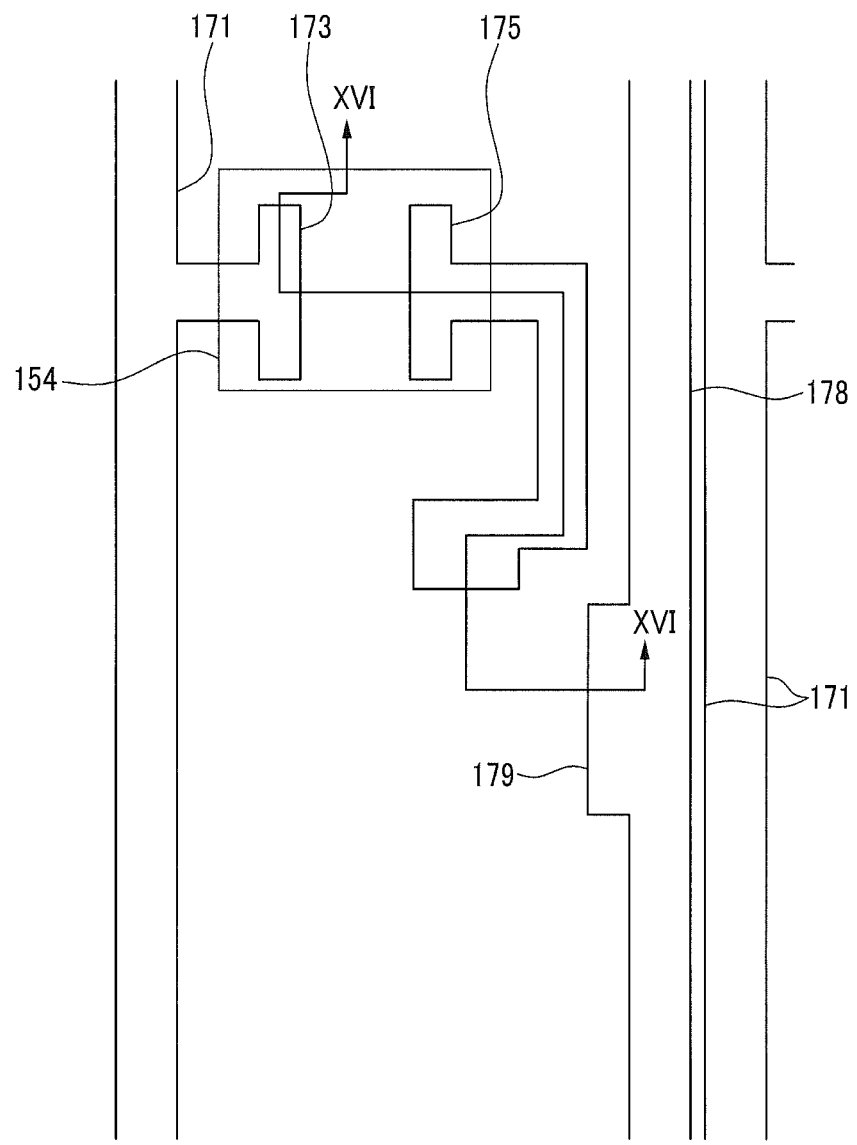

First, referring to FIGS. 13 and 14, a data line 171, a source electrode 173, a drain electrode 175, and a storage electrode line 178 that includes a storage electrode 179 are formed by layering a barrier layer 101 that includes silicon oxide (SiOx) on an insulating substrate 110, layering a conducting layer on the barrier layer 101, and photolithographying the resulting structure.

The source electrode 173 of the data line 171, the drain electrode 175, and the storage electrode 179 of the storage electrode line 178 have a dual-layer structure that is formed of lower layers 173p, 175p, and 179p and upper layers 173q, 175q, and 179q. The lower layers 173p, 175p, and 179p may include a metal such as aluminum (Al), molybdenum (Mo), copper (Cu), mercury (Ag), chromium (Cr), tungsten (W), niobium (Nb), titanium (Ti) or tantalum (Ta) or an alloy thereof, and may have a multilayer structure including the metal and/or alloy thereof.

Figure 16:
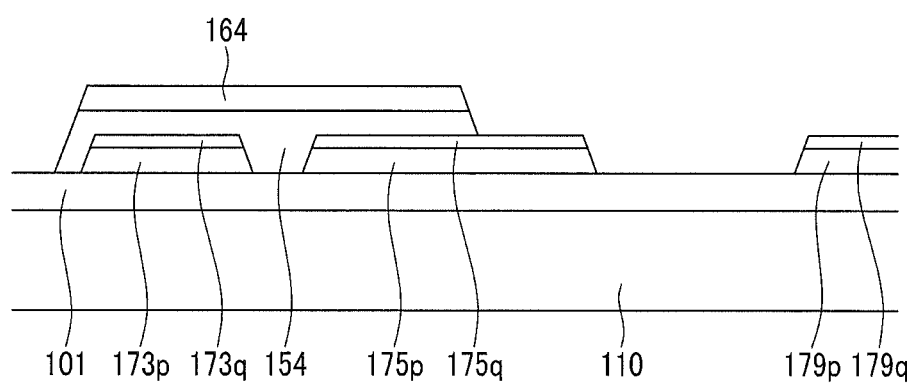
FIG. 16 is a cross-sectional view taken along line XVI-XVI of the TFT array panel of FIG. 15.
Figure 17A:
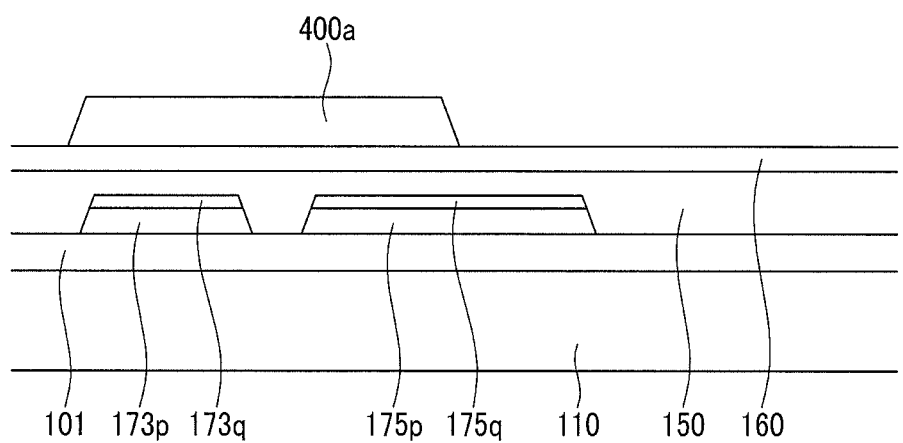
FIGS. 17A to 17C are cross-sectional views that sequentially illustrate the manufacturing method of the TFT array panel of FIGS. 15 and 16.
Figure 17B:
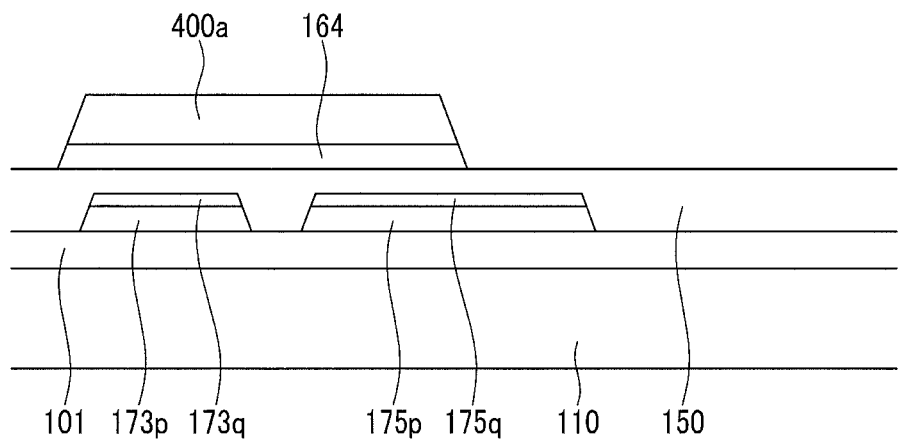
Figure 17C:
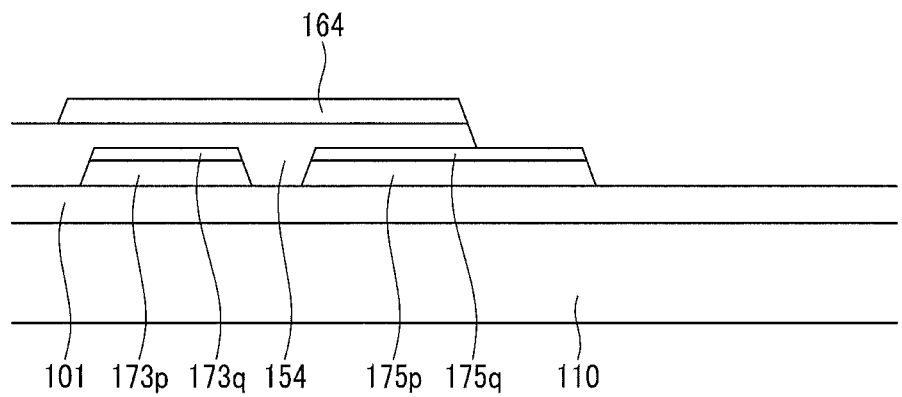

Next, referring to FIGS. 15 and 16, the oxide semiconductor 154 and insulating layer pattern 164 are formed on and overlapping the source electrode 173 and drain electrode 175. Then, the exemplary embodiment of the manufacturing method of the TFT array panel that is illustrated in FIGS. 15 and 16 will be described with reference to FIGS. 17A to 17C.

First, as shown in FIG. 17A, the photosensitive film pattern 400a is formed by sequentially layering oxide semiconductor layer material 150 and insulating layer material 160, layering photosensitive film material thereon, and exposing and developing the resulting structure.

The oxide semiconductor material 150 includes oxide of zinc (Zn), gallium (Ga), tin (Sn) or indium (In) as a basis, or zinc oxide (ZnO), indium-gallium-zinc oxide (InGaZnO$_4$), indium-zinc oxide (Zn—In—O), or zinc-tin oxide (Zn—Sn—O) that are complex oxides thereof, and may be layered by a solution process such as an inkjet process.

Next, as shown in FIG. 17B, an insulating layer pattern 164 is formed by etching the insulating layer material 160 with the photosensitive film pattern 400a as the mask. As shown in FIG. 17C, the oxide semiconductor 154 is formed by removing the photosensitive film pattern 400a and etching the oxide semiconductor layer material 150 with the insulating layer pattern 164 as the mask.

In the illustrated exemplary embodiment, the insulating layer pattern 164 is etched by using the photosensitive film pattern 400a, but in the case when the insulating layer pattern 164 is formed of the insulating material that has photosensitivity properties, the semiconductor 154 may be formed by directly exposing and developing the insulating layer material 160 that forms the insulating layer pattern 164 without an additional photosensitive film pattern, forming a desired insulating layer pattern 164, and etching the semiconductor layer material 150 with the insulating layer pattern 164 as the mask.

Since the semiconductor 154 is formed with the insulating layer pattern 164 as the mask, the insulating layer pattern 164 has the substantially same plane shape as the semiconductor 154.

Figure 18:
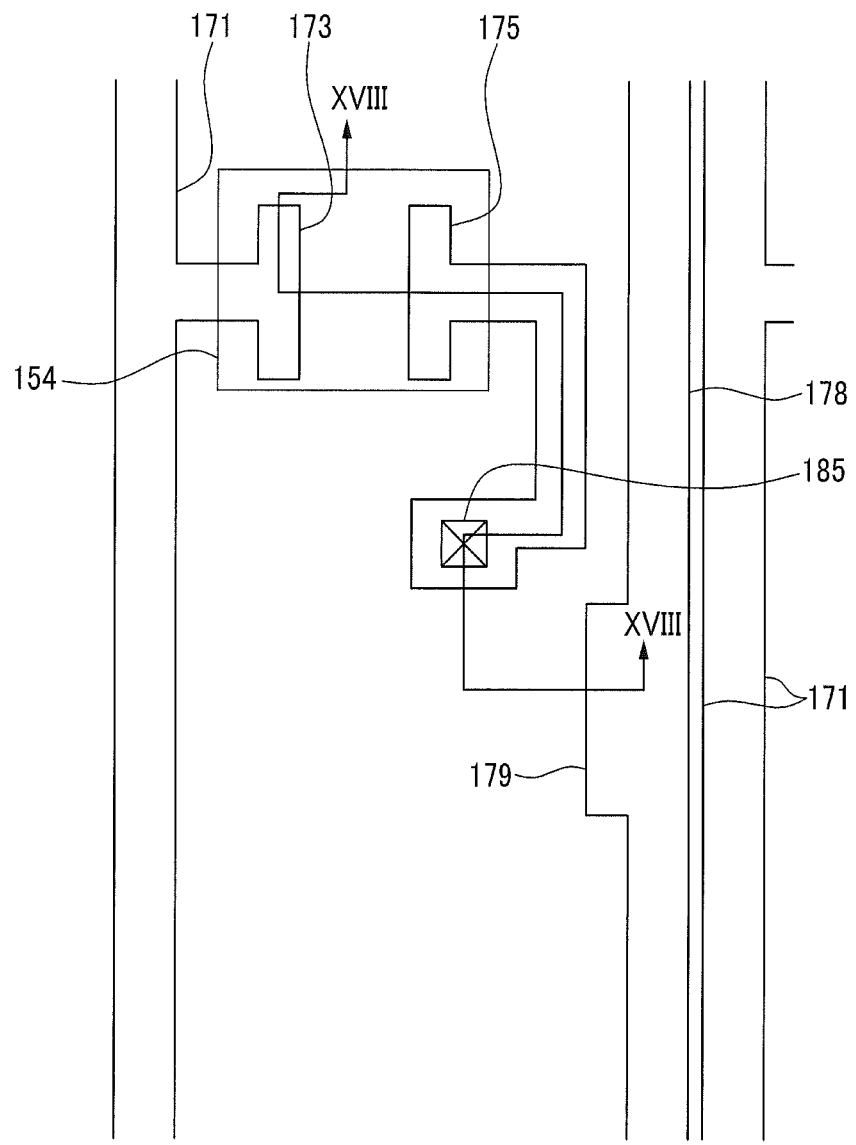
FIG. 18 is a plan view of another exemplary embodiment of one pixel of a TFT array panel, according to the present invention.
Figure 19:
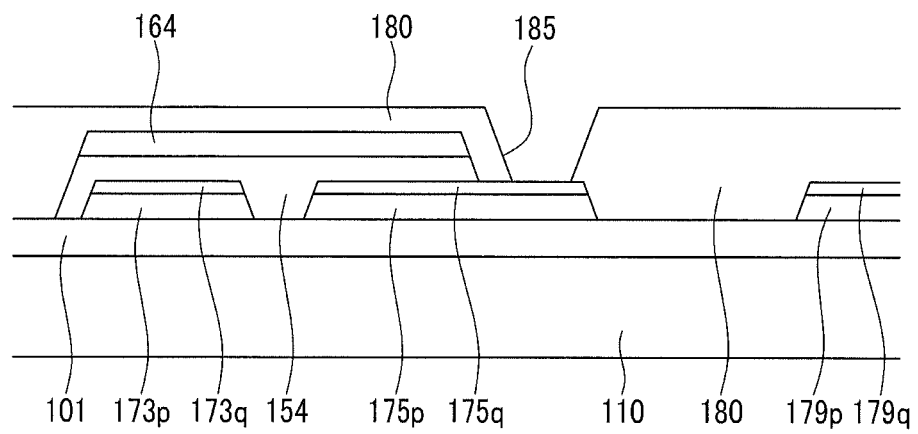
FIG. 19 is a cross-sectional view taken along line XVIII-XVIII of the TFT array panel of FIG. 18.

Next, with reference to FIGS. 18 and 19, a passivation layer 180 including a contact hole 185 exposing a portion of the drain electrode 175 is formed by layering and etching an inorganic insulator such as silicon nitride or silicon oxide, an organic insulator, and an insulator having low dielectricity on the insulating layer pattern 164.

Next, as shown in FIGS. 11 and 12, the gate line 121 that includes the gate electrode 124 overlapping the oxide semiconductor 154 and the pixel electrode 191 that is contacted with the drain electrode 175 through the contact hole 185 are formed on the passivation layer 180. The gate line 121 and pixel electrode 191 are simultaneously formed by layering the same conducting layer and photolithographying the resulting structure. The gate line 121 and pixel electrode 191 may include materials such as metals having good reflection characteristics.

According to the illustrated exemplary embodiment of the manufacturing method of the TFT array panel according to the present invention, since it is possible to reduce or effectively prevent damage to the oxide semiconductor in the manufacturing process without using a further etching stop layer, such as by forming a data line, a source electrode and a drain electrode before the oxide semiconductor layer is formed, by forming the oxide semiconductor and insulating layer pattern, by covering (e.g., overlapping) the oxide semiconductor layer with the passivation layer that acts as the gate insulating layer for protection, and by forming the gate line and gate electrode after the passivation layer is formed, the manufacturing process is simplified and a manufacturing cost is reduced. In addition, the manufacturing process is further simplified and the manufacturing cost is further reduced by simultaneously forming the pixel electrode in conjunction with the gate line and gate electrode with the same layer.

Figure 20:
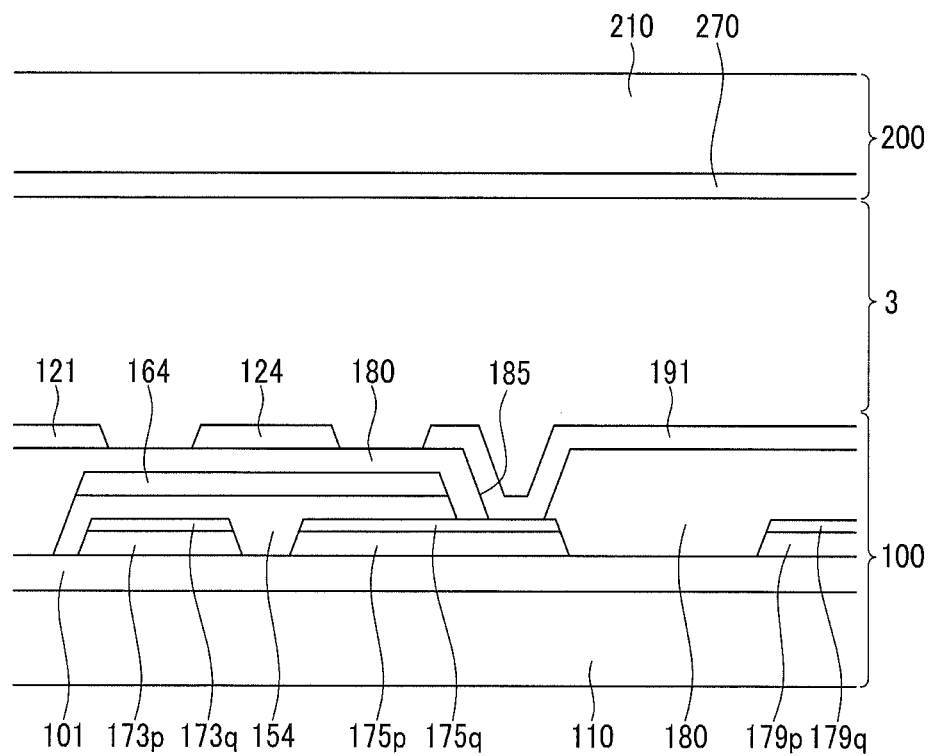
FIG. 20 is a cross-sectional view of another exemplary embodiment of a display device, according to the present invention.

A display device that includes the TFT array panel according to the exemplary embodiment of FIG. 1 to FIG. 19 will be described with reference to FIG. 20. FIG. 20 is a cross-sectional view of another exemplary embodiment of a display device according to the present invention.

With reference to FIG. 20, the display device includes a TFT array display panel 100 and a common electrode display panel 200 that face each other, and a liquid crystal layer 3 that is between the two display panels 100 and 200.

The TFT array display panel 100 is the same as the TFT array panel according to the exemplary embodiment that is illustrated in FIG. 11 and FIG. 12.

The barrier layer 101 is disposed on a first insulating substrate 110, the source electrode 173, the drain electrode 175, and the storage electrode 179 are disposed on the barrier layer 101, and the oxide semiconductor 154 and insulating layer pattern 164 that have the same plane shape are disposed on and overlapping the source electrode 173 and drain electrode 175. The passivation layer 180 that has the contact hole 185 exposing the drain electrode 175 is disposed on the insulating layer pattern 164, and the gate electrode 124 and pixel electrode 191 are disposed on the passivation layer 180. In a manufacturing method, the gate line 121 and pixel electrode 191 are simultaneously formed in a same layer.

The common electrode display panel 200 includes a common electrode 270 that is disposed on a second insulating substrate 210. Although not shown in the drawings, the common electrode display panel 200 may further include a light blocking member and a color filter.

The liquid crystal layer 3 includes a plurality of liquid crystal molecules (not shown). If a voltage is applied to the pixel electrode 191 and common electrode 270, an electric field is generated in the liquid crystal layer 3, and the arrangement of the liquid crystal molecules is changed according to a change of the intensity of the electric field. In one exemplary embodiment, for example, the polarization of light is changed by changing the arrangement of the liquid crystal molecules of the liquid crystal layer, while the electric field is applied. A polarizer (not shown) displays a desired image by appropriately blocking or transmitting polarized light such that light and dark regions are generated. The display device according to the illustrated exemplary embodiment may be a reflective liquid crystal display device in which light transmitted from an outside of the display device, such as natural light rays, is initially transmitted through the liquid crystal layer 3, reflected, and then transmitted back through the liquid crystal layer 3.

Figure 21:
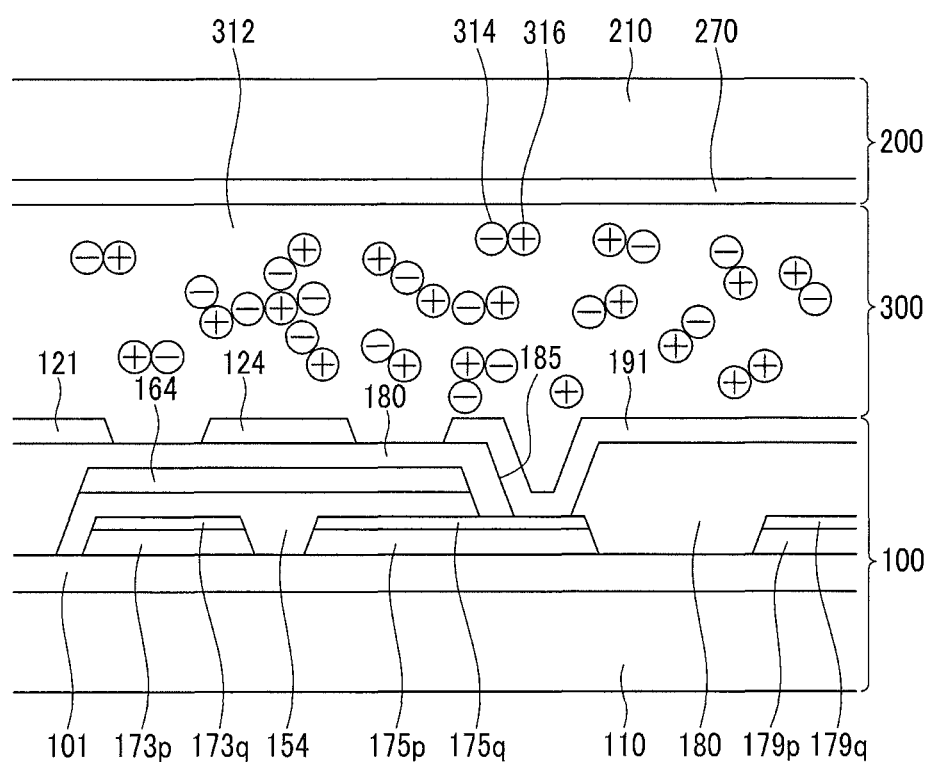
FIG. 21 is a cross-sectional view of another exemplary embodiment of a display device, according to the present invention.

Another exemplary embodiment of a display device that includes the TFT array panel according to the present invention will be described with reference to FIG. 21. FIG. 21 is a cross-sectional view of another exemplary embodiment of a display device according to the present invention.

With reference to FIG. 21, the display device includes a TFT array display panel 100 and a common electrode display panel 200 that face each other, and an electrophoretic member 300 that is disposed between two display panels 100 and 200. The electrophoretic member 300 includes electrophoretic particles 314 and 316.

The TFT array display panel 100 is the same as the TFT array panel according to the exemplary embodiment that is illustrated in FIG. 11 and FIG. 12.

The barrier layer 101 is disposed on a first insulating substrate 110, the source electrode 173, the drain electrode 175 and the storage electrode 179 are disposed on the barrier layer 101, and the oxide semiconductor 154 and insulating layer pattern 164 that have the same plane shape are disposed on e.g., overlapping) the source electrode 173 and drain electrode 175. The passivation layer 180 that has the contact hole 185 exposing the drain electrode 175 is disposed directly on the insulating layer pattern 164, and the gate electrode 124 and pixel electrode 191 are disposed on the passivation layer 180. In a manufacturing method, the gate line 121 and pixel electrode 191 are simultaneously formed in a same layer.

The common electrode display panel 200 includes a common electrode 270 that is disposed on a second insulating substrate 210. The common electrode 270 is a transparent electrode including ITO or IZO, and a common voltage is applied to each electrophoretic particle 314 and 316 of the electrophoretic member 300.

The common electrode 270 that applies the common voltage displays black and white gray or color images having various brightnesses by applying a predetermined voltage for driving for a predetermined time to each electrophoretic particle 314 and 316 in conjunction with the pixel electrode 190 applying the data voltage and changing the positions of the electrophoretic particles 314 and 316.

The electrophoretic member 300 includes a transparent solvent 312, and a first electrophoretic particle 314 and a second electrophoretic particle 316 that are irregularly dispersed in the transparent solvent 312.

The first electrophoretic particle 314 is a charged particle that has a white color and displays white to the outside of the display device by reflecting external light and has a negative (−) charge. The second electrophoretic particle 316 is a charged particle that has a black color and displays black to the outside of the display panel by absorbing external light and has a positive (+) charge. In an alternative exemplary embodiment, the first electrophoretic particle 314 and the second electrophoretic particle 316 may have the positive charge and negative charge, respectively.

In an alternative exemplary embodiment of the display device, the electrophoretic member 300 may includes the first and second electrophoretic particles 314 and 316, and a plurality of microcapsules that stores the solvent 312. In this case, the electrophoretic member 300 including the microcapsules may be fixed by a binder or a fixed film between both display panels 100 and 200.

The display device that includes the TFT array panel according to exemplary embodiments of the present invention may be all flat panel displays using the TFT array panel, in addition to the liquid crystal display and electrophoretic display according to the exemplary embodiment as described above.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A thin film transistor array panel comprising:
   a source electrode and a drain electrode on an insulating substrate;
   an oxide semiconductor disposed on the source electrode and the drain electrode;
   a passivation layer which covers the oxide semiconductor and the insulating substrate;
   a gate electrode disposed on the passivation lyer; and
   a pixel electrode connected to the drain electrode,
   wherein the gate electrode and pixel electrode are in a same single layer.

2. The thin film transistor array panel of claim 1, further comprising:
   a barrier layer disposed between the insulating substrate and the source electrode and the drain electrode.

3. The thin film transistor array panel of claim 2, wherein:
   the barrier layer includes silicon oxide (SiOx).

4. The thin film transistor array panel of claim 2, wherein:
   the source electrode and the drain electrode are each a dual-layer structure which includes a lower layer and an upper layer.

5. The thin film transistor array panel of claim 4, wherein:
   the lower layer comprises an opaque metal including one of aluminum (Al), molybdenum (Mo), copper (Cu), mercury (Ag), chromium (Cr), tungsten (W), niobium (Nb), titanium (Ti) and tantalum (Ta), and
   the upper layer comprises a transparent conducting oxide including one of an oxide of indium (In), zinc (Zn), tin (Sn), aluminum (Al) and gallium (Ga).

6. The thin film transistor array panel of claim 4, wherein:
   the passivation layer includes a contact hole which exposes a portion of the drain electrode, and
   the pixel electrode is connected to the drain electrode through the contact hole.

7. The thin film transistor array panel of claim 6, further comprising:
   an insulating layer pattern disposed on the oxide semiconductor, and having a same plane shape as the oxide semiconductor.

8. The thin film transistor array panel of claim 1, wherein:
   the source electrode and the drain electrode are each a dual-layer structure which includes a lower layer and an upper layer.

9. The thin film transistor array panel of claim 8, wherein:
   the lower layer comprises an opaque metal including one of aluminum (Al), molybdenum (Mo), copper (Cu), mercury (Ag), chromium (Cr), tungsten (W), niobium (Nb), titanium (Ti) and tantalum (Ta), and
   the upper layer comprises a transparent conducting oxide including one of an oxide of indium (In), zinc (Zn), tin (Sn), aluminum (Al) and gallium (Ga).

10. The thin film transistor array panel of claim 8, wherein:
    the passivation layer includes a contact hole which exposes a portion of the drain electrode; and
    the pixel electrode is connected to the drain electrode through the contact hole.

11. The thin film transistor array panel of claim 8, further comprising:
    an insulating layer pattern disposed on the oxide semiconductor, and having a same plane shape as the oxide semiconductor.

12. The thin film transistor array panel of claim 1, wherein:
    the passivation layer includes a contact hole which exposes a portion of the drain electrode; and
    the pixel electrode is connected to the drain electrode through the contact hole.

13. The thin film transistor array panel of claim 1, further comprising:
    an insulating layer pattern disposed on the oxide semiconductor, and having a same plane shape as the oxide semiconductor.

14. A display device comprising:
    a first display panel which includes:
       a source electrode and a drain electrode on a first insulating substrate;
       an oxide semiconductor on the source electrode and the drain electrode;
       a passivation layer which covers the oxide semiconductor and the first insulating substrate;
       a gate electrode on the passivation layer; and
       a pixel electrode connected to the drain electrode, and in a same single layer as the gate electrode;
    a second display panel facing the first display panel, and including a common electrode on a second insulating substrate; and
    a liquid crystal layer between the first display panel and the second display panel.

15. The display device of claim 14, wherein the first display panel further includes:
    a barrier layer disposed between the insulating substrate and the source electrode and the drain electrode.

16. The display device of claim 15, wherein:
    the barrier layer includes silicon oxide (SiOx).

17. The display device of claim 15, wherein:
    the source electrode and the drain electrode are each a dual-layer structure which includes a lower layer and an upper layer.

18. The display device of claim 17, wherein:
    the lower layer comprises an opaque metal including one of aluminum (Al), molybdenum (Mo), copper (Cu), mercury (Ag), chromium (Cr), tungsten (W), niobium (Nb), titanium (Ti) and tantalum (Ta), and
    the upper layer comprises a transparent conducting oxide including one of an oxide of indium (In), zinc (Zn), tin (Sn), aluminum (Al) and gallium (Ga).

19. The display device of claim 17, wherein:
    the passivation layer includes a contact hole which exposes a portion of the drain electrode, and
    the pixel electrode is connected to the drain electrode through the contact hole.

20. The display device of claim 17, further comprising:
    an insulating layer pattern on the oxide semiconductor and having a same plane shape as the oxide semiconductor.

21. The display device of claim 14, wherein:
    the source electrode and drain electrode are each a dual-layer structure which includes a lower layer and an upper layer.

22. The display device of claim 21, wherein:
    the lower layer comprises an opaque metal including one of aluminum (Al), molybdenum (Mo), copper (Cu), mercury (Ag), chromium (Cr), tungsten (W), niobium (Nb), titanium (Ti) and tantalum (Ta), and the upper layer comprises a transparent conducting oxide including one of an oxide of indium (In), zinc (Zn), tin (Sn), aluminum (Al) and gallium (Ga).

23. The display device of claim 21, wherein:
the passivation layer includes a contact hole which exposes a portion of the drain electrode, and
the pixel electrode is connected to the drain electrode through the contact hole.

24. The display device of claim 21, further comprising:
an insulating layer pattern disposed on the oxide semiconductor, and having a same plane shape as the oxide semiconductor.

25. The display device of claim 14, wherein:
the passivation layer includes a contact hole which exposes a portion of the drain electrode, and
the pixel electrode is connected to the drain electrode through the contact hole.

26. The display device of claim 14, further comprising:
an insulating layer pattern disposed on the oxide semiconductor, and having a same plane shape as the oxide semiconductor.

27. A display device comprising:
a first display panel which includes:
a source electrode and a drain electrode on a first insulating substrate;
an oxide semiconductor on the source electrode and the drain electrode;
a passivation layer covers the oxide semiconductor and the first insulating substrate;
a gate electrode on the passivation layer; and
a pixel electrode connected to the drain electrode, and in a same single layer as the gate electrode;
a second display panel facing the first display panel, and including a common electrode on a second insulating substrate; and
an electrophoretic member between the first display panel and the second display panel, and including a first electrophoretic particle and a second electrophoretic particle having different charges.

28. The display device of claim 27, wherein the first display panel further includes:
a barrier layer disposed between the insulating substrate and the source electrode and the drain electrode.

29. The display device of claim 28, wherein:
the barrier layer includes silicon oxide (SiOx).

30. The display device of claim 28, wherein:
the source electrode and the drain electrode are each a dual-layer structure which includes a lower layer and an upper layer.

31. The display device of claim 30, wherein:
the lower layer comprises an opaque metal including one of aluminum (Al), molybdenum (Mo), copper (Cu), mercury (Ag), chromium (Cr), tungsten (W), niobium (Nb), titanium (Ti) and tantalum (Ta), and
the upper layer comprises a transparent conducting oxide including one of an oxide of indium (In), zinc (Zn), tin (Sn), aluminum (Al) and gallium (Ga).

32. The display device of claim 30, wherein:
the passivation layer includes a contact hole which exposes a portion of the drain electrode, and
the pixel electrode is connected to the drain electrode through the contact hole.

33. The display device of claim 30, further comprising:
an insulating layer pattern disposed on the oxide semiconductor, and having a same plane shape as the oxide semiconductor.

34. The display device of claim 27, wherein:
the source electrode and the drain electrode are each a dual-layer structure which includes a lower layer and an upper layer.

35. The display device of claim 34, wherein:
the lower layer comprises an opaque metal including one of aluminum (Al), molybdenum (Mo), copper (Cu), mercury (Ag), chromium (Cr), tungsten (W), niobium (Nb), titanium (Ti) and tantalum (Ta), and
the upper layer comprises a transparent conducting oxide including one of an oxide of indium (In), zinc (Zn), tin (Sn), aluminum (Al) and gallium (Ga).

36. The display device of claim 34, wherein:
the passivation layer includes a contact hole which exposes a portion of the drain electrode, and
the pixel electrode is connected to the drain electrode through the contact hole.

37. The display device of claim 34, further comprising:
an insulating layer pattern disposed on the oxide semiconductor, and having a same plane shape as the oxide semiconductor.

38. The display device of claim 27, wherein:
the passivation layer including a contact hole which exposes a portion of the drain electrode, and
the pixel electrode is connected to the drain electrode through the contact hole.

39. The display device of claim 27, further comprising:
an insulating layer pattern disposed on the oxide semiconductor, and having a same plane shape as the oxide semiconductor.

* * * * *